(12) United States Patent
Bar-David et al.

(10) Patent No.: US 7,257,384 B2
(45) Date of Patent: Aug. 14, 2007

(54) METHODS AND APPARATUS FOR DETECTING THE ENVELOPE OF RF POWER SIGNALS

(75) Inventors: Israel Bar-David, Haifa (IL); Alexander Veinblat, Haifa (IL)

(73) Assignee: Paragon Communications Ltd., Haifa (IL)

( * ) Notice: Subject to any disclaimer, the term of this patent is extended or adjusted under 35 U.S.C. 154(b) by 436 days.

(21) Appl. No.: 10/418,905

(22) Filed: Apr. 18, 2003

(65) Prior Publication Data
US 2004/0018821 A1 Jan. 29, 2004

(30) Foreign Application Priority Data
Jun. 3, 2002 (IL) .................................... 150006

(51) Int. Cl.
*H04B 1/08* (2006.01)
(52) U.S. Cl. ................ 455/149; 455/130; 455/144; 330/296
(58) Field of Classification Search ........ 455/130–144; 330/296
See application file for complete search history.

(56) References Cited

U.S. PATENT DOCUMENTS

| | | | |
|---|---|---|---|
| 3,031,624 A * | 4/1962 | Moore et al. ................ | 329/369 |
| 3,070,750 A | 12/1962 | Farber ........................ | 329/169 |
| 3,514,720 A * | 5/1970 | Roucache et al. .......... | 332/168 |
| 4,466,129 A | 8/1984 | Skutta ........................ | 455/219 |
| 5,404,585 A | 4/1995 | Vimpari et al. ............. | 455/115 |
| 6,239,625 B1 * | 5/2001 | Abe ............................. | 327/58 |
| 6,351,189 B1 * | 2/2002 | Hirvilampi .................. | 330/296 |
| 6,373,331 B1 * | 4/2002 | Smiley et al. .............. | 327/545 |

FOREIGN PATENT DOCUMENTS

| | | |
|---|---|---|
| GB | 02259782 A | 3/1993 |
| WO | 0167598 | 9/2001 |

OTHER PUBLICATIONS

A.A.M. Saleh et al, Improving The Power Added Eficiency of FET Amplifiers Operating With Varying-Envelope Signals, Jan. 1983, IEEE, vol. MTT-31 No. 1, pp. 51-56.*

* cited by examiner

*Primary Examiner*—Duc M. Nguyen
*Assistant Examiner*—Justin Lee
(74) *Attorney, Agent, or Firm*—Marsteller & Associates, P.C.

(57) ABSTRACT

Apparatus for detecting the envelope of an RF signal that comprises an RF transistor operating essentially at a non-linear operating point at the RF frequency range; a DC power supply for feeding the RF transistor; a dummy load for terminating the output of the RF transistor; and at lease one impedance, through which the DC power supply feeds the RF transistor, for obtaining an indication signal developed across the impedance. The indication signal represents the envelope, from the fluctuating current drawn by the RF transistor from the DC power supply during the time period when the RF signal is applied to the feeding input.

7 Claims, 4 Drawing Sheets

METHODS AND APPARATUS FOR
DETECTING THE ENVELOPE OF RF
POWER SIGNALS

FIELD OF THE INVENTION

The present invention relates to the field of Radio Frequency (RF) detectors. More particularly, the invention relates to an amplifier-based RF detector for real-time detection of the amplitude envelope of RF signals, having large power level.

BACKGROUND OF THE INVENTION

Conventional communication systems employ RF power amplifies for controlling the magnitude of transmitted signals. Such RF power amplifiers sometimes require the detection of the level of input signals to, or output signals from, said amplifiers, in order to allow the adaptation of their performance to varying signal levels. Such requirement is disclosed, for example, in WO 01/67598, which discloses an RF power amplifier that changes its operation mode whenever the level of the input signal to said power amplifier exceeds a predetermined threshold level. Therefore, prompt reliable detection of signal levels is essential for optimal operation of such amplifier.

A conventional technique for the detection of RF signals employs diode-based detector based detectors. However, such detector diodes are usually capable of handling low-power signals, in the order of mW, which are typical levels in various laboratory equipment and in communications receivers. In recent years, high performance RF power amplifiers have been developed, which are capable of handling transmission in the KW power range. Consequently, the ancillary circuitry designed for properly controlling such power amplifiers are often required to detect much higher levels of RF signals, such as to output pulses, in the order of several Watts. Therefore, whenever diode-based detectors are used to detect the envelope of an RF signal, this envelope should also be amplified (since the actual detected signal is the mean value of the envelope), resulting in a substantial delay, which is unacceptable when fast occurring changes in the amplitude of the RF signal should be detected and used for control.

The method described above has not yet provided satisfactory solutions to the problem of real-time amplitude detection of high level RF signals, amplified by an RF power amplifier.

It is an object of the present invention to provide an apparatus for detecting the amplitude of high level RF signals, essentially without delay.

It is still another object of the present invention to provide an apparatus for detecting the amplitude of high level RF signals, and outputting corresponding high-level envelope signals.

Other objects and advantages of the invention will become apparent as the description proceeds.

SUMMARY OF THE INVENTION

The present invention is directed to a method for detecting the envelope of an RF signal. An RF transistor, operating essentially at a non-linear operating point, such as in Class B, Class AB or Class C, at the RF frequency range, is provided. The RF transistor is fed by a DC power supply through an RF filter and terminated by a dummy load for the RF components in the output signal of the RF transistor. An RF signal is feeding into the input of the RF transistor and an output signal representing the envelope from the fluctuating current drawn by the RF transistor from the DC power supply during the time period when the RF signal is applied to the input is obtained. The detected signal may be obtained by filtering out the RF components from the fluctuating current, thereby obtaining the mean detected current, being monotonically related to the envelope of the RF signal.

Whenever the RF transistor is a FET having a grounded source or a bipolar transistor having a grounded emitter, the output signal is obtained by connecting one contact of an RF filter to the drain of the FET or to the collector of the bipolar transistor, connecting the negative contact of the DC power supply to ground, connecting the positive contact of the DC power supply to the other contact of the RF filter through a impedance, which may be a pure resistance, a pure reactance or any combination thereof, and coupling the voltage developed across the impedance by a coupling capacitor. By doing so, the polarity of the output signal is determined to be opposite to the polarity of the DC power supply.

Whenever the RF transistor is a FET having a drain, or a bipolar transistor having an collector, being connected to the positive contact of the DC power supply, the output signal is obtained by connecting the negative contact of the DC power supply to ground, connecting the source of the FET or the emitter of the bipolar transistor to ground through a impedance, biasing the gate of the FET, or the base of the bipolar transistor, through a biasing resistor connected in series with an RF filter, connected to the gate or to the base, connecting a capacitor between the common contact of the RF filter and the biasing resistor, and the source or the emitter and coupling the voltage developed across the impedance by a coupling capacitor. By doing so, the polarity of the output signal is determined to have polarity being similar to the polarity of the DC power supply.

Two output signals having opposite polarities may be obtained by connecting one contact of an RF filter to the drain of the FET or to the collector of the bipolar transistor, connecting the negative contact of the DC power supply to ground, connecting the positive contact of the DC power supply to the other contact of the RF filter through a first impedance, connecting the source of the FET or the emitter of the bipolar transistor to ground through a second impedance, biasing the gate of the FET or the base of the bipolar transistor through a biasing resistor connected in series with an RF filter, connected to the gate or to the base, connecting a capacitor between the common contact of the RF filter and the biasing resistor, and the source or the emitter, coupling the voltage developed across the first impedance by a coupling capacitor, for determining the polarity of the output pulse-type signal to be opposite to the polarity of the DC power supply and coupling the voltage developed across the second impedance by a coupling capacitor, for determining the polarity of the output signal to have polarity being similar to the polarity of the DC power supply.

Preferably, the input and the output of the amplifier are matched in order to cause the amplifier to be unconditionally stable under any load and/or level of RF signal.

The present invention is also directed to an apparatus for detecting the envelope of an RF signal, that comprises:
  a) an RF transistor operating essentially at a non-linear operating point at the RF frequency range;
  b) a DC power supply for feeding the RF transistor;
  c) a dummy load for terminating the output of the RF transistor; and
  d) at lease one impedance, through which the DC power supply feeds the RF transistor, for obtaining an indication signal developed across the impedance, the indication signal representing the envelope, from the fluctuating current drawn by the RF transistor from the DC power supply during the time period when the RF signal is applied to the feeding input.

The indication signal may be proportional to the envelope of the detected RF signal.

The apparatus may further comprise circuitry for matching the input and the output of the RF transistor, for causing the RF transistor to be unconditionally stable under any load and/or level of RF signal.

In one aspect, the apparatus comprises:
a) an RF power transistor biased to operate essentially under Class B condition at the RF frequency range;
b) a DC power supply for feeding the RF transistor, connected to ground by a first capacitor, and to the output port of the transistor through an RF filter for isolating RF frequency components from reaching the DC power supply;
c) an input matching circuitry for matching the RF transistor to the source of the RF signal, the amplitude of which is detected;
d) an output matching circuitry for matching the RF transistor to a dummy load, terminating the output port; and
e) an output contact, connected to a contact of the RF filter, at which an indication signal representing the amplitude, or variations in the amplitude, from the fluctuating current drawn by the RF transistor from the DC power supply during the time period when the RF signal is applied by the source, is developed.

Whenever the RF transistor is a FET having a grounded source or a bipolar transistor having a grounded emitter, the apparatus may comprise:
a) an RF filter, connected to the drain of the FET or to the collector of the bipolar transistor;
b) a DC power supply, having a negative contact being connected to ground and a positive contact being connected to the other contact of the RF filter through a impedance; and
c) a coupling capacitor, connected to the other contact, for coupling the voltage developed across the impedance, the polarity of which being opposite to the polarity of the DC power supply.

Whenever the RF transistor is a FET having a drain, or a bipolar transistor having a collector, being connected to the positive contact of the DC power supply through an RF filter, the negative contact of which is connected to ground, the apparatus may comprise:
a) a first impedance, connected between the source of the FET, or the emitter of the bipolar transistor, and ground;
b) a biasing resistor, connected in series with an RF filter that is connected to the gate of the FET or to the base of the bipolar transistor, for biasing the gate or the base;
c) a capacitor, connected between the common contact of the RF filter and the biasing resistor, and the source or the emitter; and
d) a first coupling capacitor, connected to the ungrounded contact of the first impedance, for coupling the voltage developed across the first impedance, the polarity of which being similar to the polarity of the DC power supply.

The apparatus may further comprise:
a) a second impedance, connected in series between the RF filter and the DC power supply; and
b) a second coupling capacitor, connected to the common contact between the second impedance and the RF filter, for coupling the voltage developed across the second impedance, the polarity of which being opposite to the polarity of the DC power supply.

BRIEF DESCRIPTION OF THE DRAWINGS

The above and other characteristics and advantages of the invention will be better understood through the following illustrative and non-limitative detailed description of preferred embodiments thereof, with reference to the appended drawings, wherein.

DETAILED DESCRIPTION OF PREFERRED EMBODIMENTS

The present invention utilizes the fact that a Class B amplifier is biased such that it operates only when there is an RF signal at its input. Therefore, such Class B amplifier can function as an RF detector. According to the present invention, the RF signal that is input to an RF power amplifier is coupled and fed into a Class B RF amplifier that detects its amplitude variations and presents them at output terminals.

Figure 1:
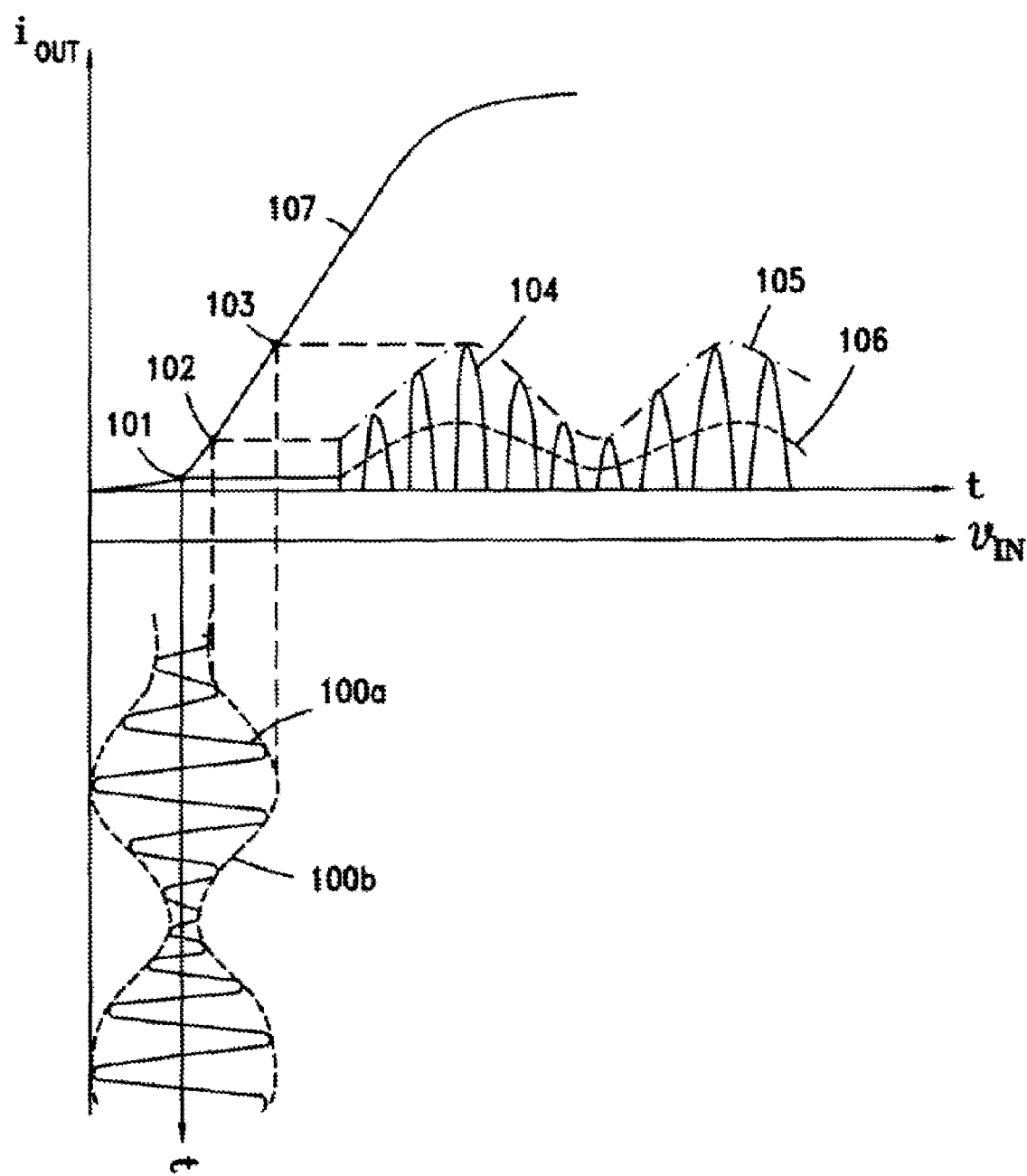
FIG. 1 schematically illustrates an input-output transfer characteristic of a Class B amplifier utilized as an RF detector, according to a preferred embodiment of the present invention.

FIG. 1 schematically illustrates an input-output transfer characteristic of a transistor (an amplifier), operating essentially in Class B and utilized, according to a preferred embodiment of the present invention, as an RF detector. Curve 107 is a typical Input-Output transfer characteristic, a major portion of which is essentially in the linear region. The operating bias point 101 of the transistor is set as close as possible to non-conduction ($i_{out}=0$), for ensuring that the transistor operates essentially in Class B. The preferred value of $V_{Bias}$ is selected in accordance with the available linear range of the transistor's transfer characteristic 107. A proper DC bias is added to the coupled RF input signal 100a, so as to ensure proper operation of the transistor essentially in Class B.

Since the detection is based on essentially Class B operation, only one half (the positive portion, in this example) of the modulated RF coupled signal is amplified by the Class B amplifier and detected, since essentially only portions of the input signal (i.e. $v_{in}$) having instantaneous voltage that is larger than zero are amplified by the Class B biased transistor. The resulting amplified signal 104 comprises essentially only half-sine waves at the operating frequency of the RF power amplifier.

As can be seen in FIG. 1, the envelope 100b of the coupled input signal is reflected by the envelope value $I_{env}$ 105 of the (fluctuating) output current 104 of the Class B amplifier, which amplifies the coupled input signal. Practically, envelope 105 is only an imaginary representation. The actual representation of the envelope is obtained by the mean value $I_{env}$ 106 of output current, which is proportional to the envelope value $I_{env}$ 105. The theoretical proportion factor is (i.e., $I_{env}=\pi*I_{mean}$). Since, $I_{env}$ is proportional to the envelope of the input signal $V_{in}$, $I_{mean}$ is also proportional to $V_{in}$. Therefore, the envelope of the input signal $V_{in}$ is represented (and detected) by the output current of the Class B amplifier.

Figure 2A:
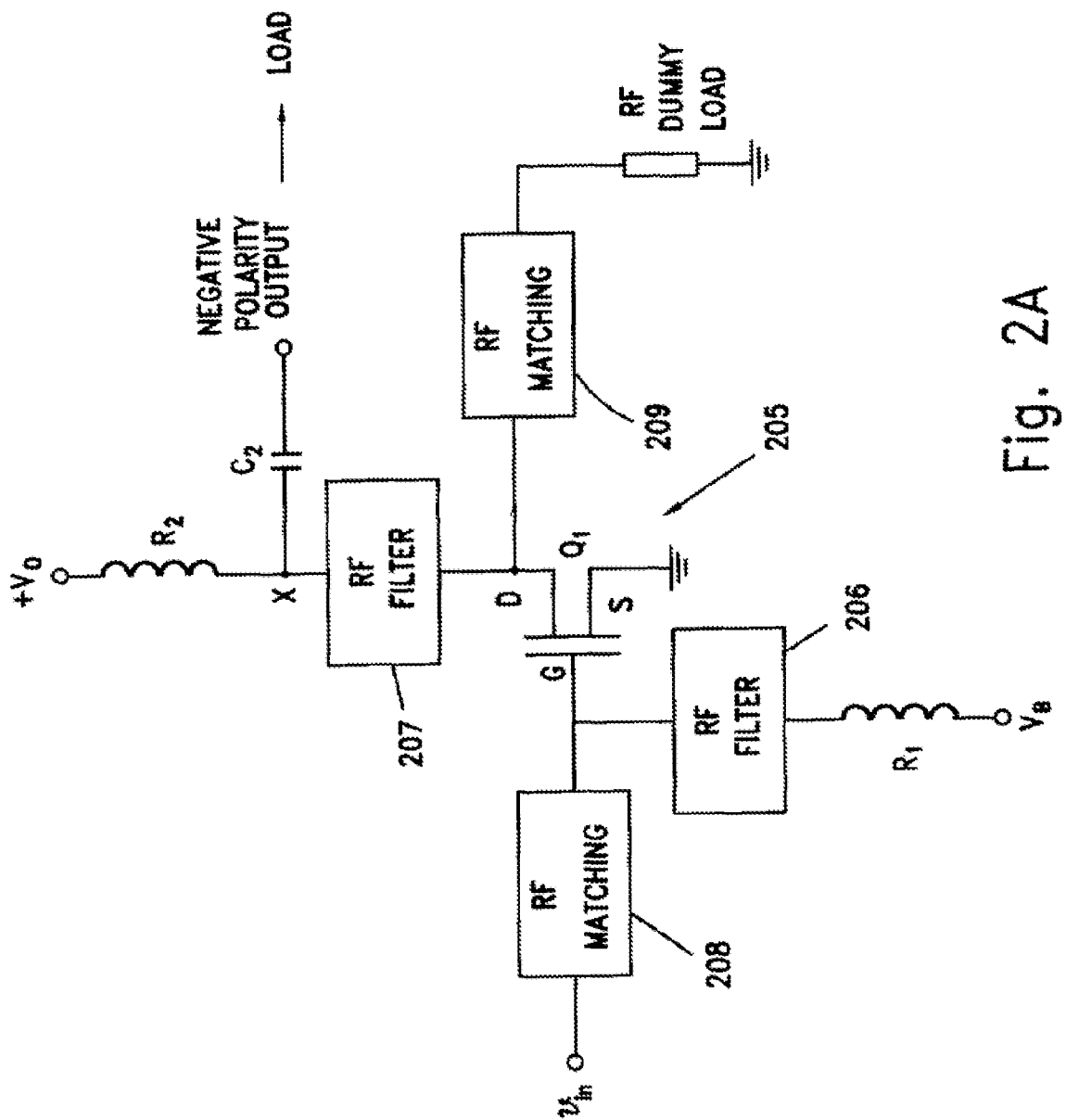
FIG. 2A schematically illustrates an implementation of a Class B amplifier used for amplitude detection of high level RF signals that yields negative polarity output, according to a preferred embodiment of the invention.

FIG. 2A schematically illustrates an implementation of a Class B amplifier used for amplitude detection of high level RF signals that yields negative polarity output, according to a preferred embodiment of the invention. The RF filters 206 and 207 are utilized for filtering out only RF frequency components, i.e., for blocking RF components from reaching the DC power supplies $V_D$ and $V_B$. Resistor R2 causes a developed fluctuating voltage, which is proportional to $I_{mean}$, to be subtracted from the supply voltage $+V_D$ at point x. The load, to which an indicative signal (i.e., of the signal envelope voltage) should be delivered, may be connected to point x via a coupling capacitor C2. Since the transistor Q1 operates at Class B, upon applying an RF input signal $v_{in}$, current is drawn from the DC power supply, and hence, the voltage at point x (which is essentially $+V_D$ with no input signal) drops to a lower value. Therefore, the detection at point x is represented by a negative polarity detected signal. This way, the power output delivered to the load can be as large as desired, up to the power handling capability of the transistor Q1, employed to implement the Class B amplifier 205. RF matching networks 208 and 209 are embedded in the input and output of transistor Q1, respectively, in series with a dummy load (an RF load used for matching the output of transistor Q1 to be unconditionally stable), so as to keep it stable under any operating condition. The gate of transistor Q1 is properly biased by resistor R1 using the voltage source $V_B$.

Figure 2B:
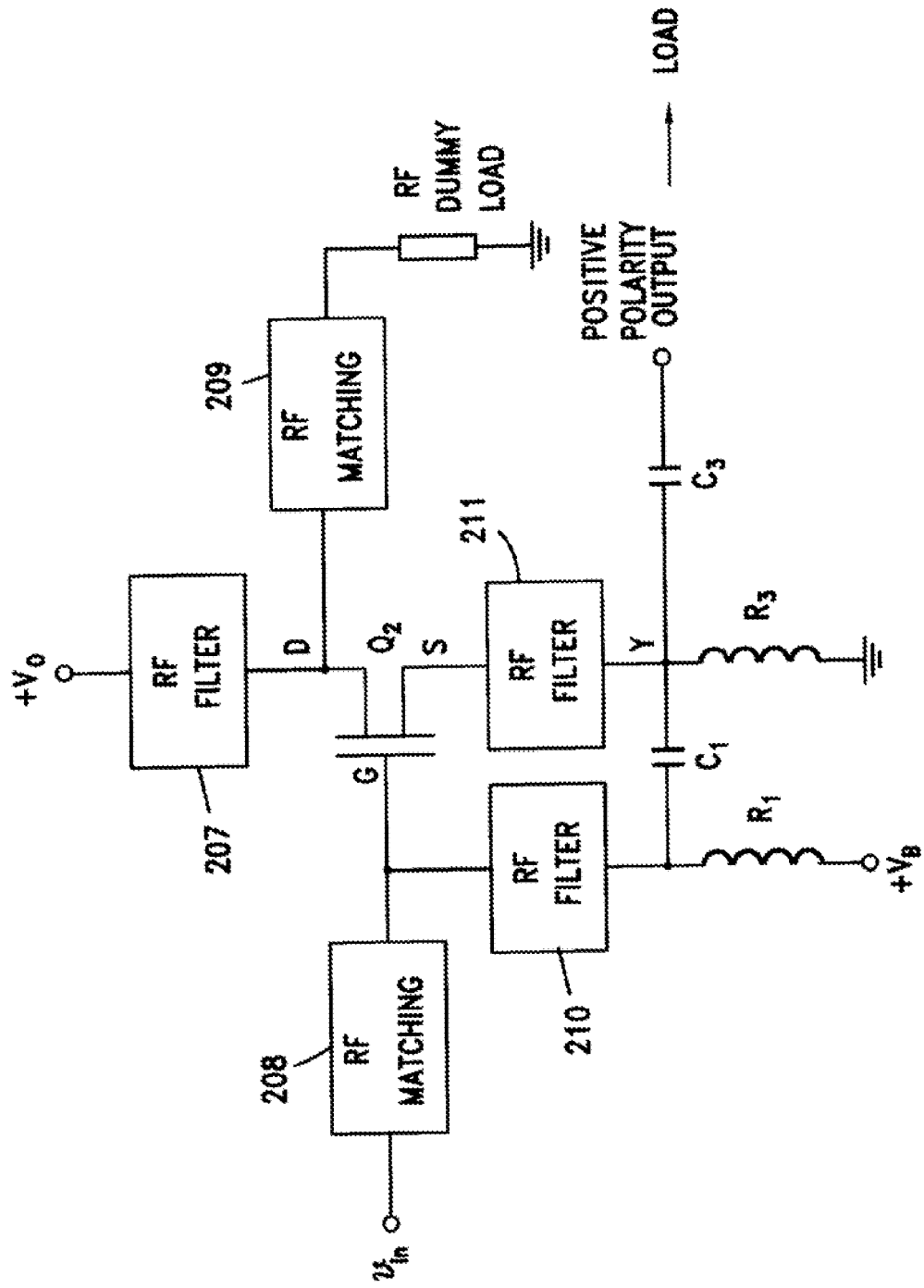
FIG. 2B schematically illustrates an implementation of a Class B amplifier used for amplitude detection of high level RF signals that yields positive polarity output, according to another preferred embodiment of the invention.

FIG. 2B schematically illustrates an implementation of a Class B amplifier used for amplitude detection of high level RF signals that yields positive polarity output, according to another preferred embodiment of the invention. In this implementation, the resistor $R_2$ and capacitor $C_2$, used for the implementation illustrated in FIG. 2A, are discarded and replaced by resistor $R_3$ and capacitor $C_3$, which are connected to the source of FET Q2 through an RF filter 211 (which may consist of, for example, a combination of an RF-choke and a capacitor). The output voltage pulse developed at point y by the current $I_{mean}$ across $R_3$ is positive and is coupled to the load by a coupling capacitor $C_3$. The gate of FET Q2 is properly biased through RF filter 210, using a biasing resistor R1 connected to the voltage source $V_B$. Capacitor $C_1$ is connected between point y and the biasing resistor $R_1$ and is intended to feed the output voltage pulse to the gate of FET Q2, so as to prevent a cut-off state of FET Q2.

Figure 2C:
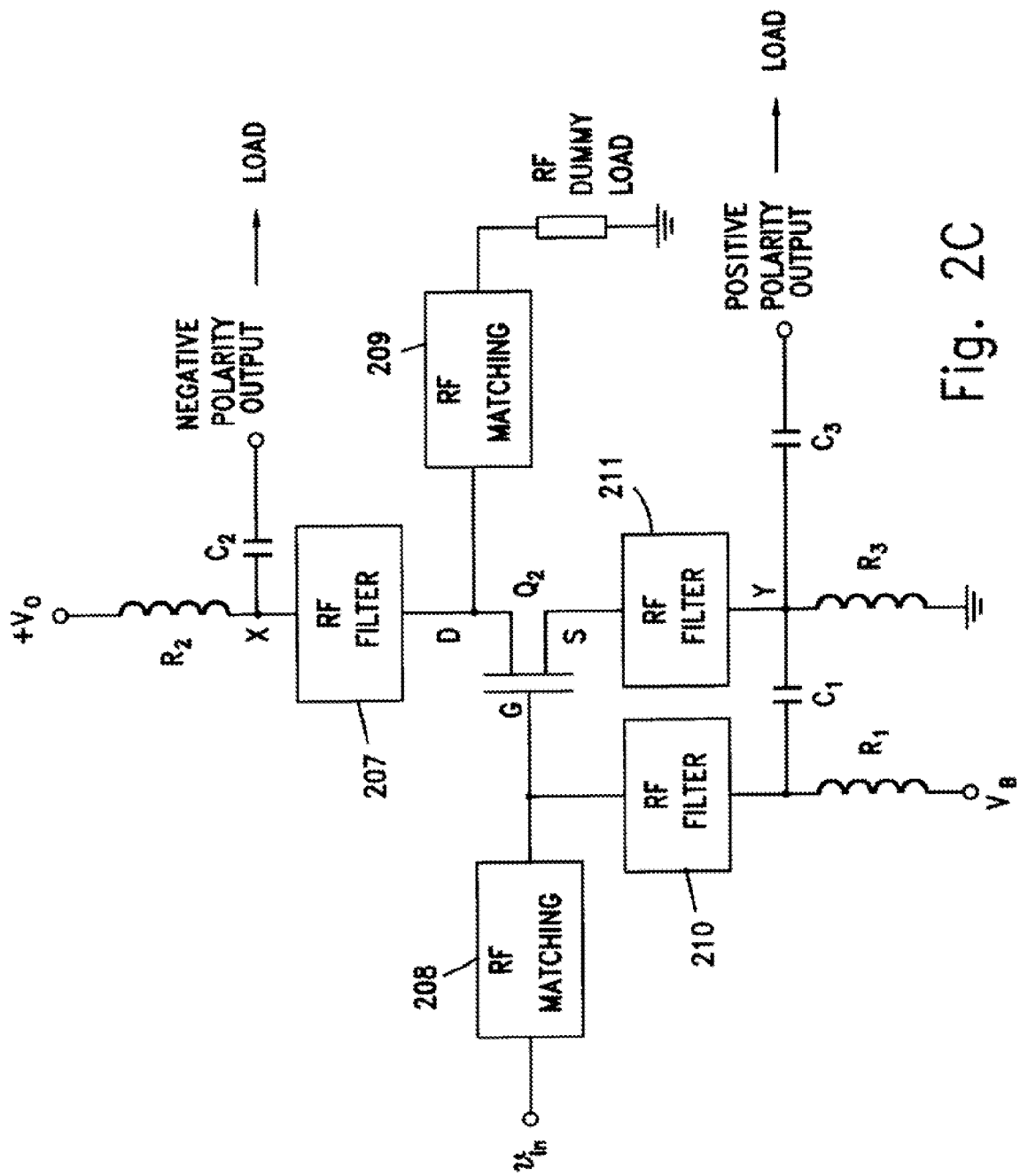
FIG. 2C schematically illustrates an implementation of a Class B amplifier used for amplitude detection of high level RF signals that yields both negative and positive polarity outputs, according to a further preferred embodiment of the present invention.

FIG. 2C schematically illustrates an implementation of a Class B amplifier used for amplitude detection of high level RF signals that yields both negative and positive polarity outputs, according to a further preferred embodiment of the present invention. The circuit illustrated in this example results from combining the features of the circuitry illustrated in FIG. 2A to those of the circuitry illustrated in FIG. 2B. Consequently, both positive and negative output signals are obtained at points y and x, respectively, from the same circuit.

It should be noted that the embodiments illustrated hereinabove can be implemented in a similar way using bipolar transistors, rather than a FET. In this case, the elements connected to the gate, drain and source should be connected to the base, collector and emitter, respectively, with proper biasing (not shown for the sake of brevity) that is obvious to any person skilled in the art. Furthermore, the technique illustrates hereinabove with respect to Class B operation may be similarly implemented by a person skilled in the art also for Class AB, Class C amplifiers, and actually for any RF transistor/amplifier that operating at a non-linear operating point. The important issue is that the requirement that the operating point 101 shown in FIG. 1 should be determined such that the output current $i_{out}$ will be larger for the positive excursions of $v_{in}$ that for the positive excursions. In addition, instead of allowing the fluctuating voltage to be developed across pure resistors (resistors R2 and R3 in FIGS. 2A to 2C above), a reactive impedance may also be employed, as well as any impedance being a combination of a resistance and a reactance.

The above examples and description have of course been provided only for the purpose of illustration, and are not intended to limit the invention in any way. As will be appreciated by the skilled person, the invention can be carried out in a great variety of ways, employing more than one technique from those described above, all without exceeding the scope of the invention.

The invention claimed is:

1. A method for detecting an envelope of an RF signal being input to an RF transistor wherein whenever the RF transistor is a FET having a grounded source or a bipolar transistor having a grounded emitter, wherein the output signal is obtained by performing the following steps:
   a) providing said RF transistor operating essentially at a non-linear operating point at the RF frequency range, said RF transistor being fed by a DC power supply through an RF filter and terminated by a dummy load for RF components in an output signal of said RF transistor;
   b) feeding said RF signal into the input of said RF transistor:
   c) obtaining an output signal representing said envelope from the fluctuating output current drawn by said RF transistor from said DC power supply during a time period when said RF signal is applied to said input:
   d) connecting a first contact of an RF filter to one of a drain of said FET or to a collector of said bipolar transistor;
   e) connecting a more negative contact of the DC power supply to ground:
   f) connecting a more positive contact of said DC power supply to a second contact of said RF filter through an impedance; and
   g) coupling the voltage developed across said impedance by a coupling capacitor, thereby determining the polarity of the output signal to be opposite to the polarity of said DC power supply;

wherein the output signal is obtained by filtering out the RF components from the fluctuating current, thereby obtaining the mean detected current, being monotonically related to the envelope of the RF signal.

2. A method for detecting an envelope of an RF signal being input to an RF transistor wherein the RF transistor is a FET having a drain, or a bipolar transistor having an collector, being connected to the more positive contact of the DC power supply, wherein the output signal is obtained by performing the following steps:
   a) providing said RF transistor op crating essentially at a non-linear operating point at the RF frequency range, said RF transistor being fed by a DC power supply through an RF filter and terminated by a dummy load for RF components in an output signal of said RF transistor;

b) feeding said RF signal into the input of said RF transistor;

c) obtaining an output signal representing said envelope from the fluctuating output current drawn by said RF transistor from said DC power supply during a time period when said RF signal is applied to said input;

d) connecting a more negative contact of the DC power supply to ground;

e) connecting one of a source of said FET or the emitter of said bipolar transistor to ground through an impedance;

f) biasing one of a gate of said FET, or the base of said bipolar transistor, through a biasing resistor connected in series with an RF filter, connected to said gate or to said base;

g) connecting a capacitor between a common contact of said RF filter and said biasing resistor, and said source or said emitter; and h) coupling the voltage developed across said impedance by a coupling capacitor, thereby determining the polarity of the output signal to have polarity being similar to the polarity of said DC power supply;

wherein the output signal is obtained by filtering out the RF components from the fluctuating current, thereby obtaining the mean detected current, being monotonically related to the envelope of the RF signal.

3. A method according to claim 2, further comprising obtaining two output signals having opposite polarities by performing the following steps:

a) connecting a first contact of an RF filter to one of a drain of said FET or to a collector of said bipolar transistor;

b) connecting the more negative contact of the DC power supply to ground;

c) connecting the more positive contact of said DC power supply to the other contact of said RF filter through a first impedance;

d) connecting one of the source of said FET or the emitter of said bipolar transistor to ground through a second impedance;

e) biasing one of the gate of said FET or the base of said bipolar transistor through a biasing resistor connected in series with an RF filter, connected to one of gate or to said base:

f) connecting a capacitor between the common contact of said RF filter and said biasing resistor, and said source or said emitter;

g) coupling the voltage developed across said first impedance by a coupling capacitor, thereby determining the polarity of the output signal to be opposite to the polarity of said DC power supply; and h) coupling the voltage developed across said second impedance by a coupling capacitor, thereby determining the polarity of the output signal to have polarity being similar to the polarity of said DC power supply.

4. Apparatus for detecting the envelope of an RF signal being input to an RF transistor, comprising:

a) an RF transistor operating essentially at a non-linear operating point at the RF frequency range;

b) a DC power supply for feeding said RF transistor:

c) a dummy load for terminating the output of said RF transistor: and d) at least one impedance through which said DC power supply feeds said RF transistor, for obtaining an indication signal developed across said impedance, said indication signal representing said envelope, from the fluctuating current drawn by said RF transistor from said DC power supply during the time period when said RF si goal is applied to the feeding input;

e) an RF power transistor biased to operate essentially under Class B condition at the RF frequency range;

f) a DC power supply for feeding said RF transistor connected to ground by a first capacitor, and to an output port of said RF transistor through an RF filter for isolating RF frequency components from reaching said DC power supply;

g) an input matching circuitry for matching said RF transistor to the source of the RF signal, the amplitude of which is detected;

h) an output matching circuitry for matching said RF transistor to a dummy load, terminating said output port; and i) an output contact, connected to a contact of said RF filter, at which an indication signal representing said amplitude, or variations in said amplitude, from the fluctuating current drawn by said RF transistor from said DC power supply during the time period when said RF signal is applied by said source, is developed.

5. Apparatus for detecting the envelope of an RF signal being input to an RF transistor wherein the RF transistor is a FET having a grounded source or a bipolar transistor having a grounded emitter, comprising:

a) an RF transistor operating essentially at a non-linear operating point at the RF frequency range;

b) a DC power supply for feeding said RF transistor;

c) a dummy load for terminating the output of said RF transistor; and d) at least one impedance through which said DC power supply feeds said RF transistor, for obtaining an indication signal developed across said impedance, said indication signal representing said envelope, from the fluctuating current drawn by said RF transistor from said DC power supply during the time period when said RF signal is applied to the feeding input;

e) an RF filter, connected to one of a drain of said FET or to a collector of said bipolar transistor;

f) a DC power supply, having a negative contact being connected to ground and a positive contact being connected to the other contact of said RF filter through an impedance; and g) a coupling capacitor, connected to said other contact, for coupling the voltage developed across said impedance, the polarity of which being opposite to the polarity of said DC power supply.

6. Apparatus for detecting the envelope of an RF signal being input to an RF transistor in which the RF transistor is a FET having a drains or a bipolar transistor having a collector, being connected to the more positive contact of the DC power supply through an RF filter, the more negative contact of which is connected to ground, comprising:

a) an RF transistor operating essentially at a non-linear operating point at the RF frequency range;

b) a DC power supply for feeding said RF transistor;

c) a dummy load for terminating the output of said RF transistor;

d) at least one impedance, through which said DC power supply feeds said RF transistor, for obtaining an indication signal developed across said impedance, said indication signal representing said envelope, from the fluctuating current drawn by said RF transistor from said DC power supply during the lime period when said RF signal is applied to the feeding input;

e) a first impedance, connected between one of a source of said FET, or an emitter of said bipolar transistor, and ground;

f) a biasing resistor, connected in series with an RF filter that is connected to one of the gate of said FET or to the base of said bipolar transistor, for biasing said gate or said base;

g) a capacitor, connected between a common contact of said RF filter and said biasing resistor, and one of said source or said emitter; and h) a first coupling capacitor, connected to the ungrounded contact of said first impedance, for coupling the voltage developed across said first impedance, the polarity of which being similar to the polarity of said DC power supply.

7. Apparatus according to claim 6, further comprising:

a) a second impedance, connected in series between the RF filter and the DC power supply; and b) a second coupling capacitor, connected to a common contact between said second impedance and said RF fillet for coupling the voltage developed across said second impedance, the polarity of which being opposite to the polarity of said DC power supply.

\* \* \* \* \*